(12) United States Patent
Lucek

(10) Patent No.: US 6,236,485 B1
(45) Date of Patent: May 22, 2001

(54) OPTICAL TDMA NETWORK

(75) Inventor: Julian K Lucek, Ipswich (GB)

(73) Assignee: British Telecommunications public limited company, London (GB)

( * ) Notice: Subject to any disclaimer, the term of this patent is extended or adjusted under 35 U.S.C. 154(b) by 0 days.

(21) Appl. No.: 09/029,571

(22) PCT Filed: Jun. 17, 1997

(86) PCT No.: PCT/GB97/01619

§ 371 Date: Mar. 6, 1999

§ 102(e) Date: Mar. 6, 1999

(87) PCT Pub. No.: WO97/50204

PCT Pub. Date: Dec. 31, 1997

(30) Foreign Application Priority Data

Jun. 26, 1996 (EP) .................................................. 96304694
Oct. 2, 1996 (EP) .................................................. 96307207

(51) Int. Cl.[7] ........................... H04B 10/00; H04B 16/04; H04J 14/08
(52) U.S. Cl. ......................... 359/158; 359/136; 359/140; 359/188; 359/135
(58) Field of Search .................................... 359/136, 139, 359/140, 158, 180, 188, 135; 370/321, 337

(56) References Cited

U.S. PATENT DOCUMENTS 4,568,931  2/1986  Biolley et al. .
5,073,980  12/1991  Prucnal et al. .

FOREIGN PATENT DOCUMENTS

| 209 329 | 1/1987 | (EP) . |
| 268 355 | 5/1988 | (EP) . |
| 0 268 355 A2 * | 5/1988 | (EP) .................................. H04J/3/04 |
| 95 11555 | 4/1995 | (WO) . |

OTHER PUBLICATIONS

Anonymous: "Low Skew Fiber–Optic Clock Distribution System", IBM Technical Disclosure Bulletin, vol. 26, No. 4, Sep. 1983, New York, US, p. 2143.

* cited by examiner

*Primary Examiner*—Jason Chan
*Assistant Examiner*—M. R. Sedighian
(74) *Attorney, Agent, or Firm*—Nixon & Vanderhye P.C.

(57) ABSTRACT

An optical network carrying TDMA (time division multiple access) signals includes an optical bus (1) and nodes (RN, TN) which are connected to the optical bus. The optical bus includes at least two co-located optical fiber waveguides (21, 22). At each node a receiver receives an optical data signal transmitted on one of the waveguides and an optical clock signal from another of the waveguides. The node may also include a transmitter, which may take a clock signal from one of the waveguides, modulate it, and output it as a data signal on another of the waveguides.

11 Claims, 13 Drawing Sheets

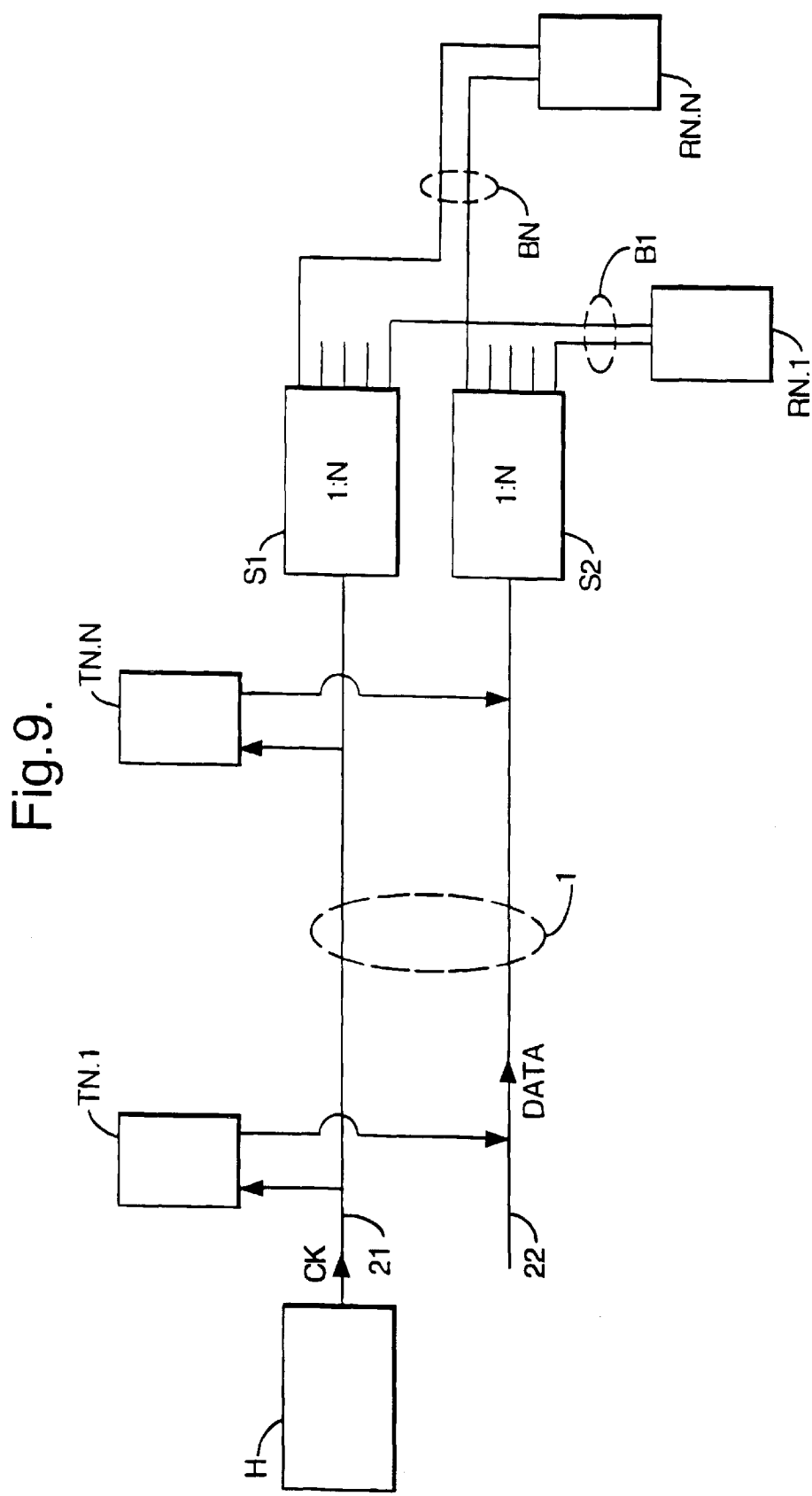

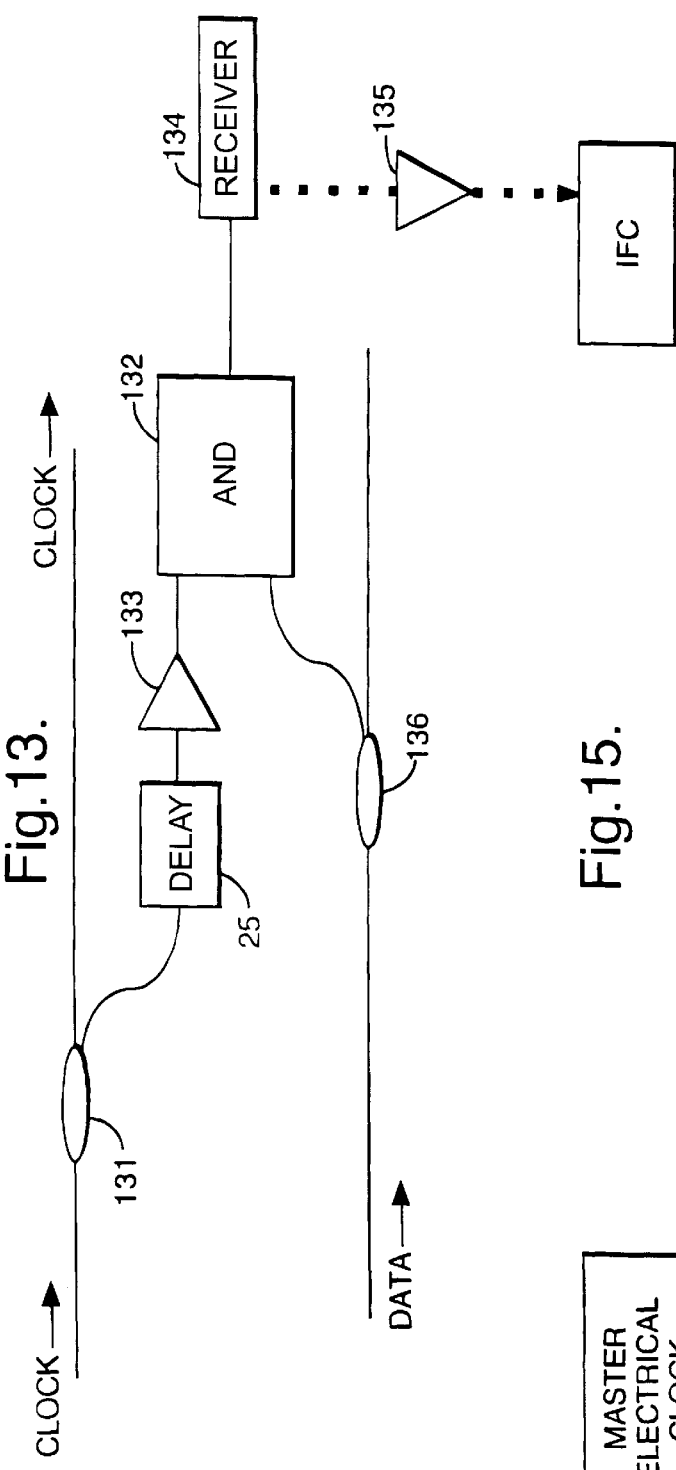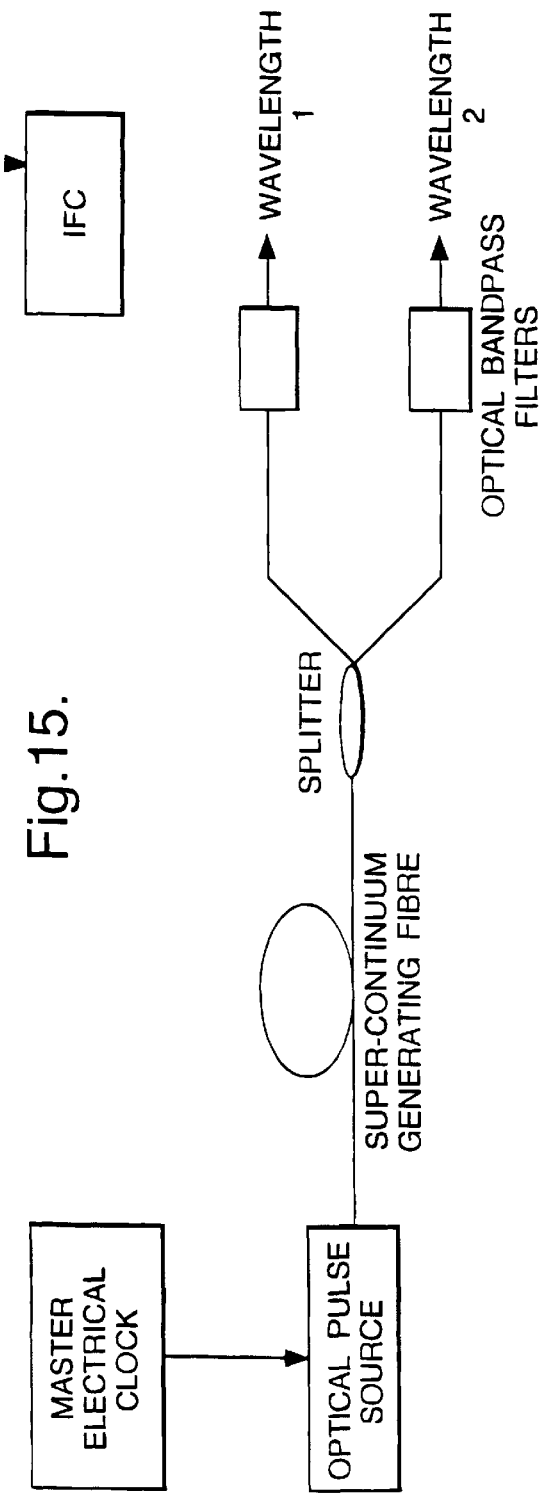

OPTICAL TDMA NETWORK

The present invention relates to an optical network and in particular to a network suitable for carrying TDMA (time division multiple access) signals. A network embodying the present invention might be used, for example, in an access network within a broadband optical telecommunications system, or in a local area network (LAN) for interconnecting computer systems.

As discussed in our co-pending European application no.9604020.9 (BT case A25109), the increasing power of computer systems in terms of processor speeds and storage capacity has made it possible for conventional personal computers to handle multimedia applications which involve real-time video and computer graphics. The high bandwidth data associated with such applications place heavy demands on the network and the performance of conventional LANs has failed to keep pace.

Optical networks using synchronous TDMA potentially offer a far higher bandwidth than conventional LANs and so might be used as a high speed LAN. However, in practice, current proposals for optical TDMA networks suffer a number of limitations.

A key design problem in the construction of optical TDMA networks is the need to distribute an optical clock signal to the different nodes on the network. This clock signal is required to enable a receiver in a node to read data from an appropriate slot, and to enable a transmitter to write to the appropriate slot. Conventionally, the optical clock signal has been transmitted together with the data. The clock signal is distinguished from the accompanying data by, for example, a different polarization state or by a different wavelength. Each node then requires a stage for separating the clock from the data. One example of this conventional approach to optical TDMA is disclosed in the paper by J G Zhang in Pure Appl. Opt. III (1994) 609–614. This discloses a network which uses a star topology and in which a clock signal at the frame rate is transmitted at a different wavelength to the data. In this system, the need to demultiplex the incoming frames to recover the clock adds undesirably to the complexity of the node and places constraints on the network topology.

A further example of a prior art network is disclosed in the paper by Nowatzyk & Prucnal published in the proceedings of 22 Annual International Symposium on Computer Architecture, June 1995. This proposes the use of a clock or "framing pulse" which is distinguished from the data pulses by a different polarization state. The receiver section of each node then requires a device to separate the data from the framing pulse. However, using such polarization multiplexing techniques, it is found that polarization characteristics of all the optical elements of the network need to be tightly controlled if the network performance is avoid degradation by interaction between the clock and the data.

European patent application number 87308169.9 (EP-A-0268355) discloses an optical communications network in which an optical synchronization signai is transmitted on one optical, modulated at the customer premises, and transmitted onto a second optical line which is located separately from the first optical line. However, while such an approach might have been possible for use at relatively lower bit rates, recent work has been directed to achieving much higher bit rates, in excess of 1 Gbit per second. At these higher bit rates schemes such as that disclosed in EP-A-0268355 fail as a result of timing variations between the two optical lines.

According to a first aspect of the present invention there is provided an optical network comprising:

(a) an optical bus including at least two co-located optical fibre waveguides;

(b) a plurality of transmitter nodes, each transmitter node including a transmitter stage connected to the optical bus and arranged to receive an optical clock signal from one of the fibre waveguides and arranged to write an optical data signal, in a time slot synchronized to the optical clock signal, onto another one of the fibre waveguides; and (c) a least one receiver node, the receiver node including a receiver stage for receiving an optical data signal which was output onto the optical bus by the transmitter stage of a transmitter node.

The present invention provides an optical network having a construction and topology markedly different from those of conventional networks. Through using a bus including two optically separate but physically co-located waveguides, the invention provides a local clock at each node which provides an accurate timing reference for reading or writing data, irrespective of the position on the bus of the node. The different waveguides may be different fibres located within a single cable, or may be different cores of a single fibre. The use of separate optical paths avoids the problems of crosstalk and susceptibility to noise associated with conventional networks in which clock and data are multiplexed on a single path using, for example different polarization states. It is found that by co-locating the waveguides timing errors can be reduced to low levels, allowing operation at very high bit rates.

Commonly, a transmitter node and receiver node may both be present at a single location. For example, this would be the case where the transmitter and receiver nodes are part of a network interface for a computer which is connected to an optical LAN and which needs both to transmit and to receive data via the LAN. The invention is not however limited in this respect, and also encompasses implementations in which transmitter nodes and receiver nodes are at different locations.

Preferably the transmitter stage includes a modulator and is arranged to generate the optical data signal by modulating the clock signal received from the one of the waveguides.

The preferred implementation of the present invention further simplifies the construction of the network nodes, by avoiding the necessity for a local optical source for data generation. Instead, the transmitter in a node takes an optical clock signal from one fibre in the bus, modulates it, and places the signal back on another fibre in the bus in the appropriate time slot.

Preferably the transmitter stage is arranged to receive an optical clock signal from a first one of the optical fibre waveguides which in use carries a write clock, and the receiver stage is arranged to read an optical clock signal from a second one of the optical fibre waveguides which in use carries a read clock.

The use of separate clocks carried on different fibres enables savings in the power budget over the extent of the network. An optical data signal produced by modulating the write clock may be carried on the same waveguide as the read clock, in which case the write and read clocks are arranged to have different wavelengths. Alternatively, the data may be carried separately from the two clock signals on a third co-located optical fibre waveguide.

The receiver nodes may be coupled to the bus via a star network. As described in further detail below, this offers the advantage of greater fault tolerance and robustness.

According to a second aspect of the present invention, there is provided a method of operating an optical network comprising an optical bus comprising at least two co-located optical fibre waveguides, a plurality of transmitter nodes connected to the optical bus, and a receiver node, the method comprising:

(a) at a transmitter node, receiving an optical clock signal from one of the fibre waveguides, and writing an optical data signal, in a time slot synchronized to the optical clock signal, onto another one of the fibre waveguides; and (b) at a receiver node, receiving an optical data signal which was output onto the optical bus in step (a).

The present invention also encompasses a local area network (LAN) suitable for interconnecting a plurality of computer systems and using a network in accordance with the first aspect.

Systems embodying the present invention will now be described in further detail, by way of example only, with reference to the accompanying drawings in which:

FIG. 9 is a schematic of a network including receivers connected in a star topology;

FIG. 13 is a circuit diagram for a receiver stage;

FIG. 15 is an example of a master clock source;

Figure 16:
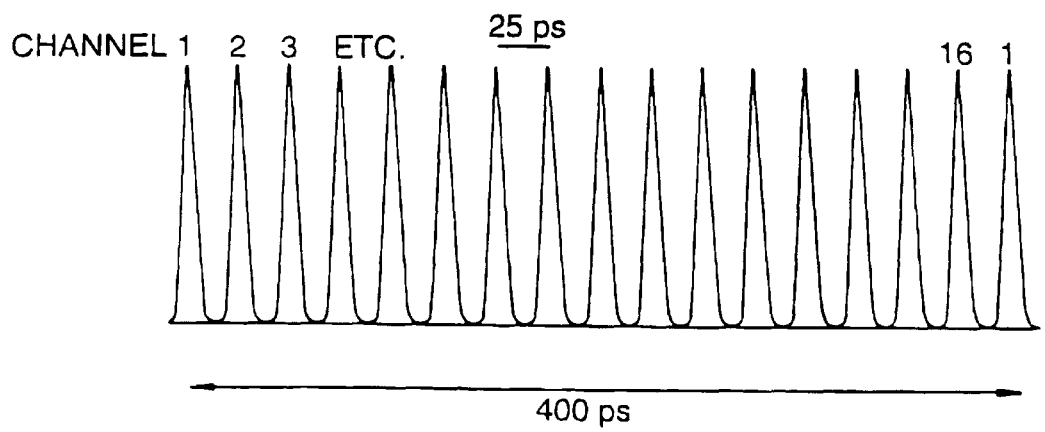
FIG. 16 is a timing diagram showing channels carried on the optical bus.
Figure 17:
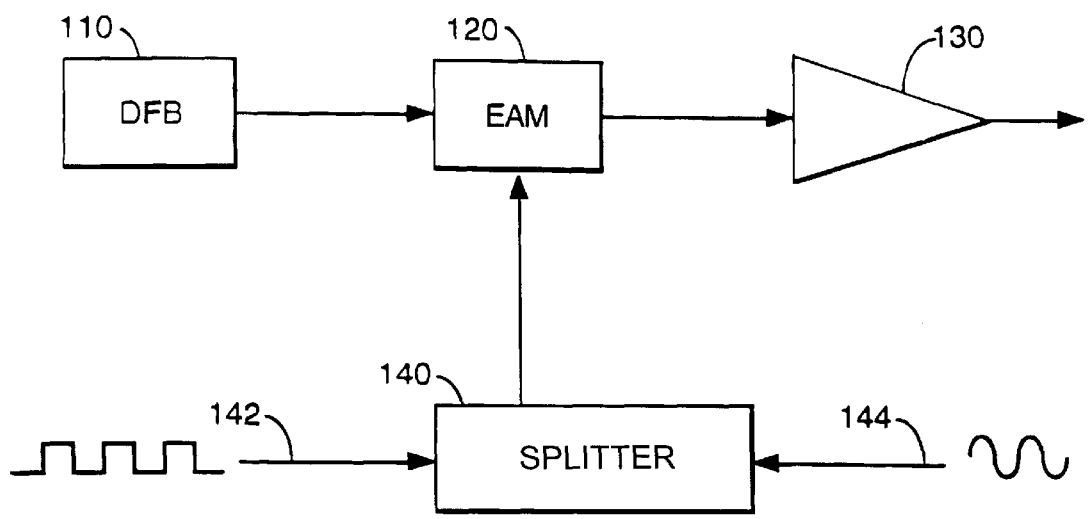
FIG. 17 illustrates a dark pulse source.

An optical network comprises a number of nodes N1, N2, N3 . . . connected to an optical fibre bus 1. In the present example, the network is a local area network (LAN) and a number of personal computer workstations PC1, PC2, PC3 . . . are connected via the optical bus to each other and to a network server 2. Although, for clarity, only three nodes are shown, in practice the network may support many more nodes. The network uses a structure termed a re-entrant bus topology. Each node has two connections to the bus, with the transmitter connected to an upstream portion of the bus, and the receiver connected to a downstream portion. Each transmitter outputs a signal in a different time slot, so that a TDMA frame is assembled on the bus. FIG. 16 shows one example of the TDMA frame. In this example the output frame contains 16 channels at a separation of 25 ps.

Figure 1:
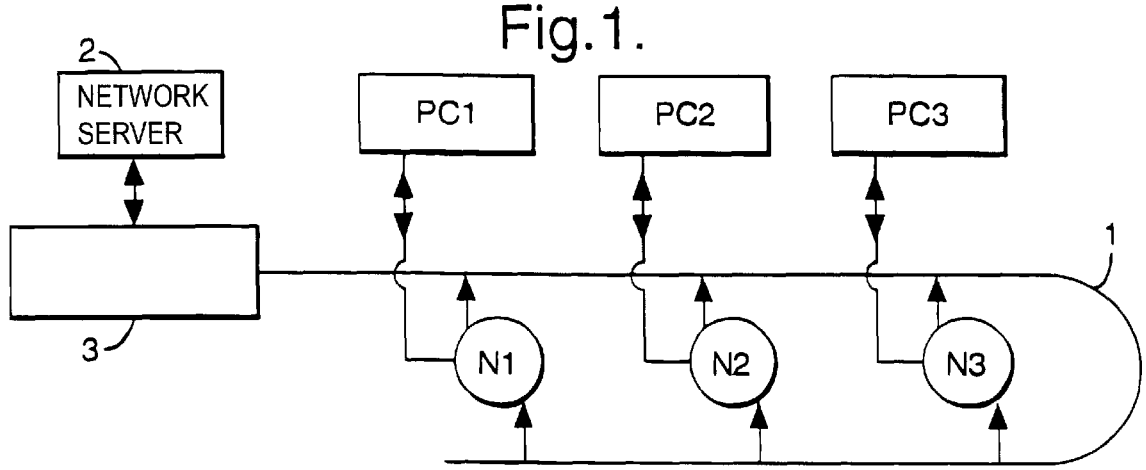
FIG. 1 is a schematic of a network embodying the present invention.
Figure 2:
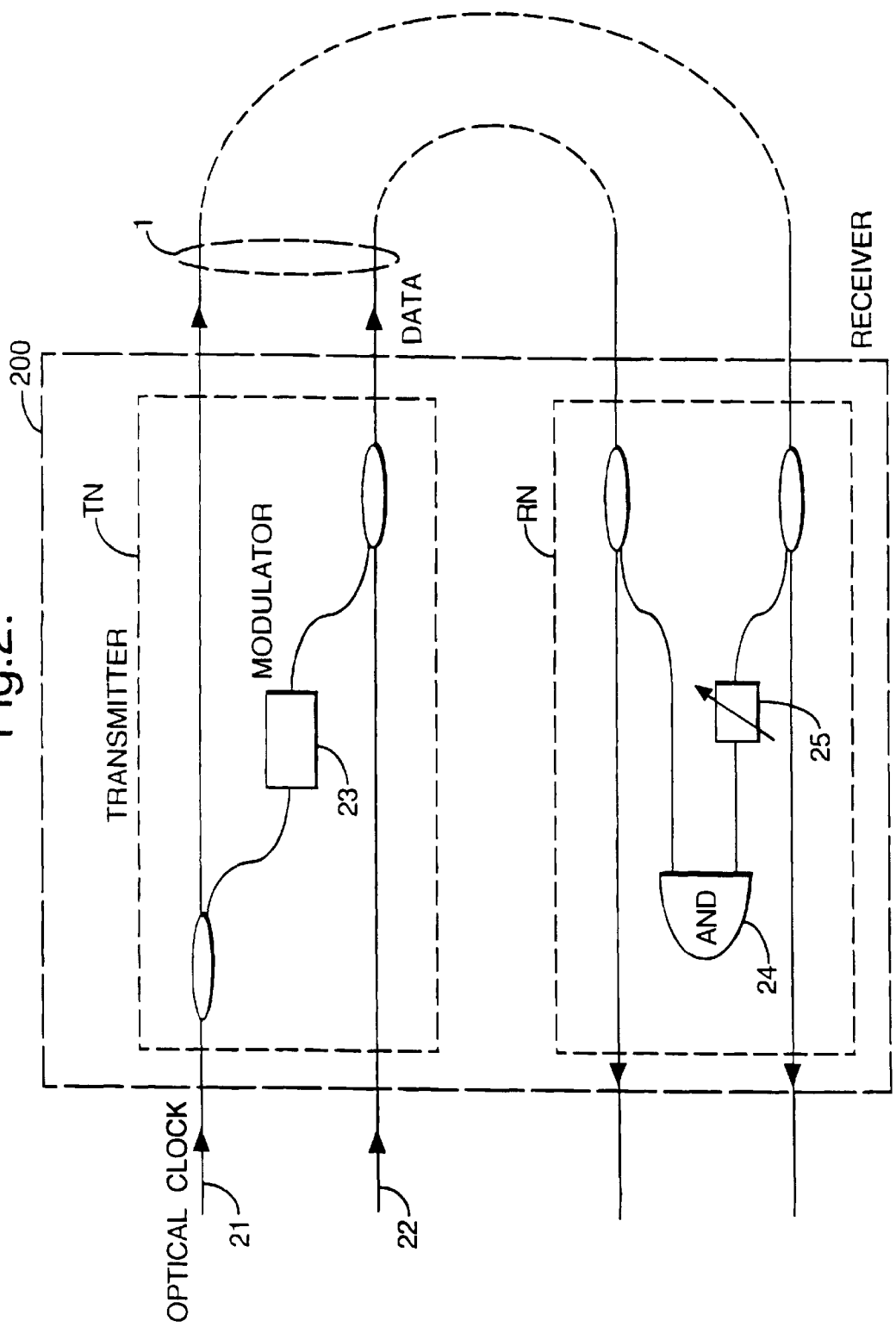
FIG. 2 shows a first example of a node for use in the network of FIG. 1.

FIG. 2 shows schematically the connections between a node 200 and the bus 1 in a first example. The bus includes two optically separate but physically co-located optical fibre waveguides 21, 22. The transmitter includes a modulator 23 which is coupled to the first waveguide 21 carrying the optical clock. The modulator is coupled via a 50:50 coupler.

The modulator 23 then modulates the optical clock signal with data, and transmits the modulated data signal out onto the second optical fibre waveguide 22.

Figure 12:
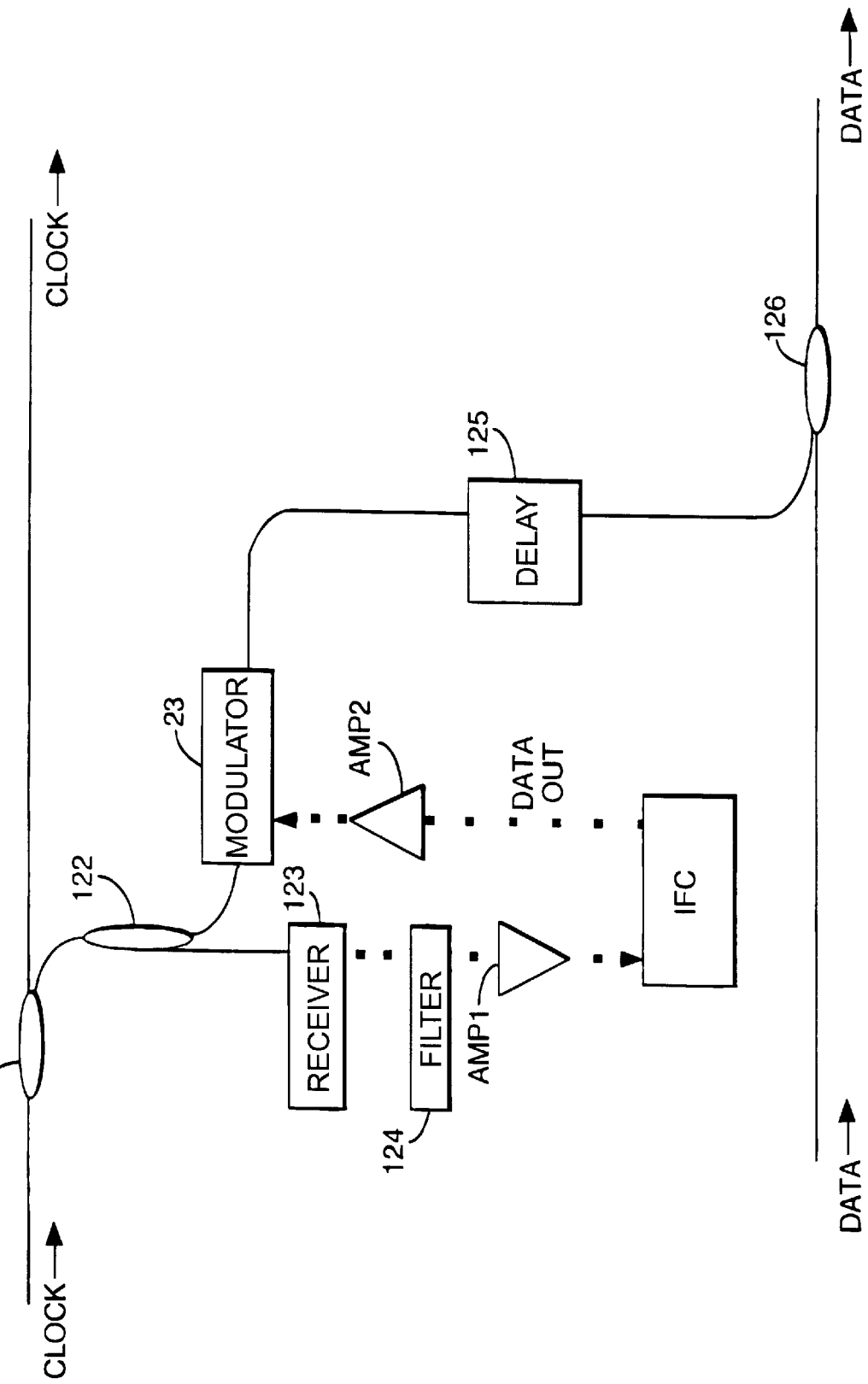
FIG. 12 is a circuit diagram of a transmitter stage.

FIG. 12 is a circuit diagram showing in detail the construction of the transmitter in this example. In the diagram, dotted lines show electrical paths, and solid lines show optical paths. A first optical coupler 121 taps the optical clock signal from the clock fibre 21. A second coupler 122 sends part of the clock to a receiver 123 and part of the clock into the modulator 23. The receiver 123 converts the optical signal into the electrical domain. Its output is filtered by an electrical bandpass filter 124. The bandpass filter is centred at the clock frequency. The output of the bandpass filter 124 is an electrical sine-wave at the clock frequency. This is amplified by a first amplifier AMP1. The amplified signal is input to a network interface card IFC. The network interface card links the node, for example, to a local workstation which receives/transmits data via the bus. The network interface card IFC synchronizes its data output to the electrical clock signal received from the amplifier AMP1. The data output from the network interface card IFC is amplified by a second amplifier AMP2 and applied to the modulator 23 so as to modulate the optical clock. The modulator is advantageously polarization insensitive and may, for example, be an electro-absorption modulator. The optical data from the modulator 23 is coupled into the data bus via a third coupler 126. Optionally, there is an optical delay line before coupler 126. The delay line 125 allows selection of the time slot on the bus into which the data is inserted.

Suitable commercially available components for implementing this circuit are as follows: couplers 1 and 3—50:50 coupler P22S15A50; coupler 2—90:10 coupler P22S15A10 both from Sifam Limited. Receiver: type PDC2201, BT&D/Hewlett-Packard; bandpass filter—BA-2488-100 Daden-Anthony Associates (CA, USA). Amp 1: type 60_20_1, Nucletudes SA (Les Ulis, France). Amp 2 WBA—000108D ERA Technologies (Leatherhead, UK). Optical delay line—type ODL-600 Santec (Aichi, Japan 485). Alternatively, the optical delay line may be a word-forming network as described in the present applicants co-pending International application no. WO 94/21088.

The receiver stage of the node is coupled to a downstream portion of the bus. Data is read from the bus using an optical AND gate 24 and a variable delay stage 25 to select the appropriate TDMA channel. A clock signal is coupled from the first optical fibre 21 into a first input of the AND gate and the data signal is coupled via the variable delay into the second input of the AND gate. Alternatively and equivalently, a variable delay may be applied to the data signal The AND gate may be an SLA-NOLM or may be an integrated semiconductor device. Appropriate devices are described in the applicant's International Application PCT/GB 95/00425.

FIG. 13 shows in detail the construction of the receiver stage in this example. A first coupler 131 is used to tap the optical clock signal from one of the optical fibre waveguides. The clock signal passes through an optical delay line 25 and optical amplifier 133. The delay line is used to align the optical clock with a required data channel. The optical amplifier 133 increases the power of the optical clock to the level required to drive the optical gate. A second optical coupler 136 taps data from the other optical fibre waveguide. The output of an optical AND gate 132 is converted to the electrical delay by a receiver 134, amplified in electrical amplifier 135 and fed to the network interface card IFC.

The components for implementing the circuit are as for the transmitter stage discussed above. The optical AND gate may use four wave mixing in an SLA as described in the above-cited International application PCT/GB 95100425. Alternatively the optical AND gate may be an integrated Mach-Zehnder device as described by Ludwig et al, Electronics Letters, Vol. 32, page 327, 1996.

Figure 14:
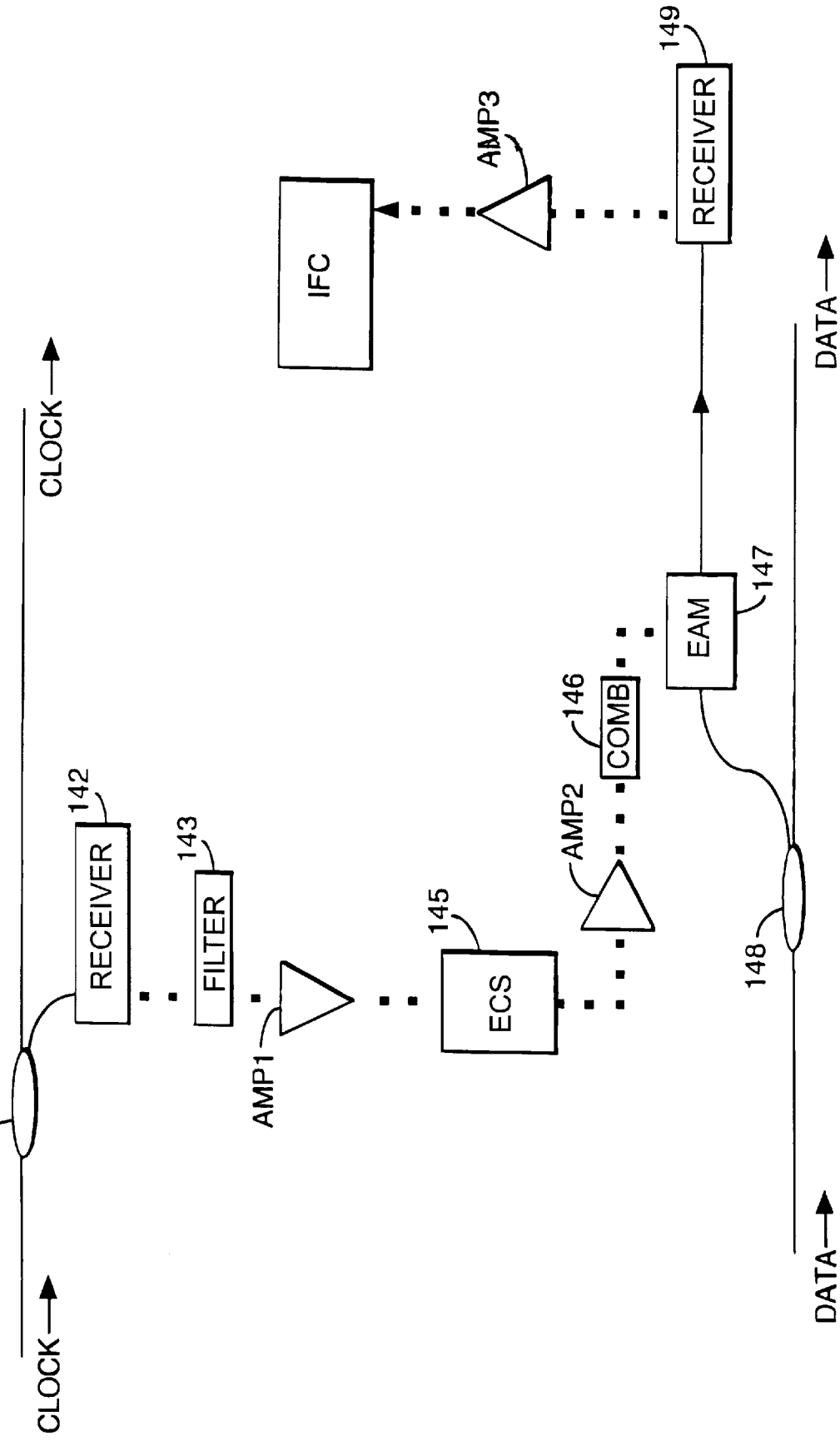
FIG. 14 is a circuit diagram of a second example of a receiver stage.

FIG. 14 shows a second alternative implementation of the receiver stage using, in this case, an electro-optic gate. The optical clock is tapped at a first coupler 141 and converted to the electrical domain by a receiver 142. The signal is filtered in a bandpass filter 143 and amplified in a first amplifier AMP 1. The resulting signal is input to an electrical channel selector (ECS) as described below with reference to FIGS. 8a and 8b. The output from the electrical channel selector 145 passes through a second amplifier AMP 2 and a comb generator 146 before being applied to an electro-absorption modulator (EAM) 147. The applied electrical signal gates the electro-absorption modulator to select one data channel from the incoming data channels. These data channels are tapped from the optical fibre by a second coupler 148. The output of the electro-absorption modulator is converted to the electrical domain by a receiver 149 and is amplified by a third amplifier AMP 3 before being input to the network interface card IFC.

Suitable components for the receivers, filter and couplers are as described above in relation to the transmitter. Other suitable components are as follows: Amp 1: type 60_20_1—Nucletudes SA, 91 944 (Les Ulis, France); Amp 2: Mini-circuits type ZHL13 42—Mini-Circuits Europe (Camberley, Surrey); Amp 3: type WBA000108D—ERA Technologies (Leatherhead); comb generator: HP33000 series—Hewlett-Packard (Bracknell, Berkshire). An appropriate EAM is described in the paper by D. G. Moodie et al., Electron. Letts., Aug. 3, 1995, 31, no.16.

Figure 8A:
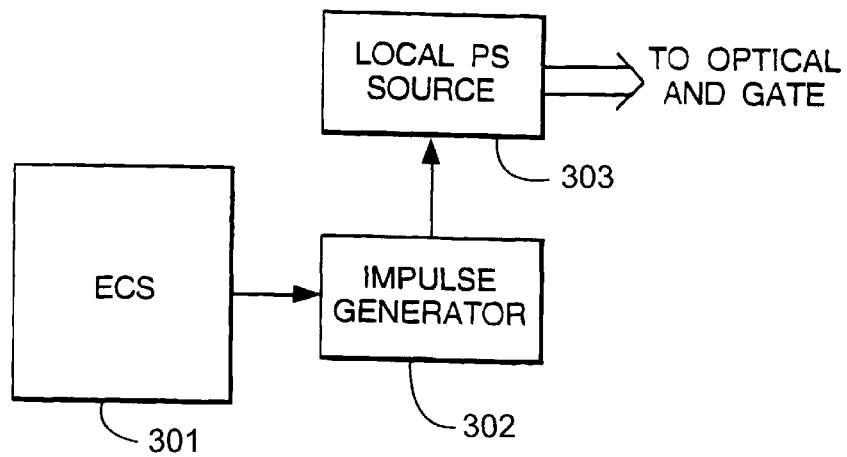
FIGS. 8a and 8b show a variable delay stage for use in one of the receivers of FIGS. 2–4.
Figure 8B:
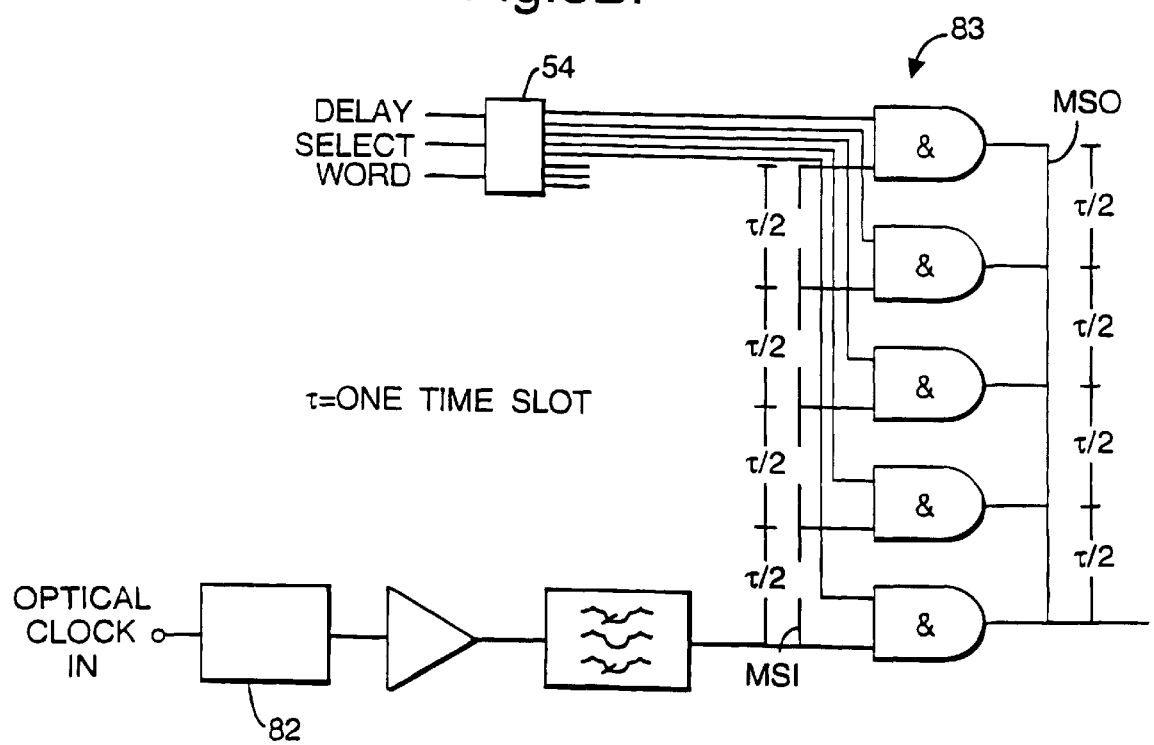

One example of a variable delay stage suitable for use in the receiver stage of FIG. 14 is shown in FIGS. 8a and 8b. As described in our above-cited co-pending European application, this delay stage is designed to carry out channel selection in the electrical domain, while the reading of the TDMA channel remains in the optical domain. FIG. 8a shows how the electrical channel selector (ECS) 301 drives a local picosecond source 303 via an impulse generator 302. This output from the local picosecond source then provides one of the two inputs to the optical AND gate. FIG. 8b shows in detail the construction of the electrical channel selector. In the selector the optical clock signal from the first waveguide is detected using a detector 82 which might be, for example, a PIN photodiode. After amplification, the signal is filtered to generate a clean electrical sine wave. The signal is then input to a delay stage 83 comprising a series of electrical AND gates LG arranged in a linear array. The array is implemented as a low-cost chip available commercially as NELNLB6202. The AND gates control access to a microstrip delay line. The delay line is accurately stepped in delays to the channel separation of the LAN. For a system operating at 40 Gbit/s, the channel delay T equal 25 ps. The array of AND gates is controlled via an input from a demultiplexer 54. In this example, the demultiplexer is a NEL4705 device manufactured by NEL. The demultiplexer converts an incoming serial delay select word generated by the workstation connected to the node into an appropriate gating signal for the AND gate. In this way the workstation selects the appropriate delay to transmit data on its respective channel.

The construction and operation of the variable delay stage are described in further detail in our co-pending European application cited above, the contents of which are incorporated herein by reference. As an alternative to the ESC, a VCO (voltage controlled oscillator) may be used in an analogous manner to select the channel.

Figure 5:
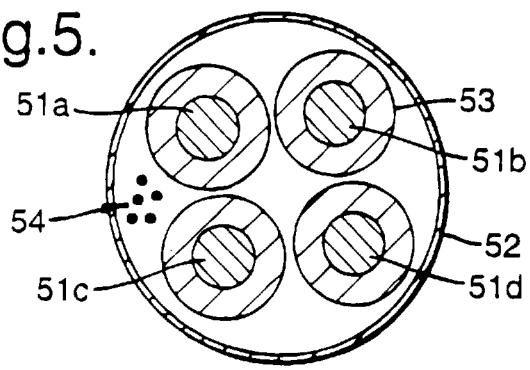
FIG. 5 shows a first example of the construction of an optical bus for use in the network of FIG. 1.

FIG. 5 shows a first example of the physical construction of the optical bus. This example uses a blown fibre cable construction. Four optical fibres 51a–51d, each of which is a standard telecommunications fibre of 125 microns diameter, are located within the outer jacket 52 of the cable. Each fibre is surrounded by a 250 $\mu$m polymer jacket 53. Aramid yarn fibres 54 in the interstices of the optical fibres provide reinforcement for the cable. Any two of the fibres, for example those referenced 51a and 51b, may be used to provide the two fibres 21,22 of the network of FIG. 2. As described below, for networks using other configurations, 3 or more fibres may be used.

Blown fibre cable construction is described in further detail in the present applicant's European patent no. EP 108590.

Using an optical bus constructed as described above, it is found that the relative jitter between optical signals in different ones of the optical fibres is negligibly small, for example over a cable of length 1 km the jitter is less than 2 ps. This allows a clock transmitted on one of the fibres to provide a timing reference for data signals transmitted on one or more of the other fibres, as discussed above in relation to FIG. 2.

Figure 6:
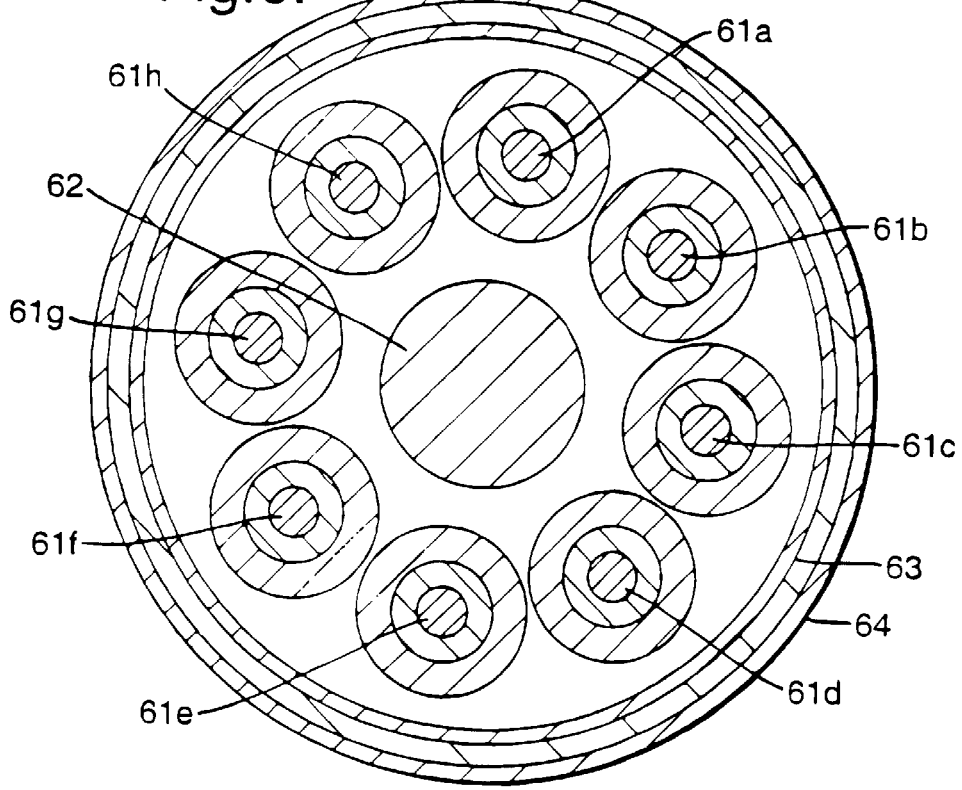
FIG. 6 shows a second example of an optical bus.

FIG. 6 shows an alternative construction for the optical bus. In this example the bus is formed from a steel-cored cable, with 8 optical fibre waveguides 61a–h surrounding the steel core 62. As in the first example the waveguides are formed of standard telecommunications fibre of 125 $\mu$m diameter. Each is surrounded by a 250 $\mu$m inner jacket and a 900 $\mu$m outer jacket. The waveguides and the core are surrounded by a 2-ply sheath 63,64.

Figure 7:
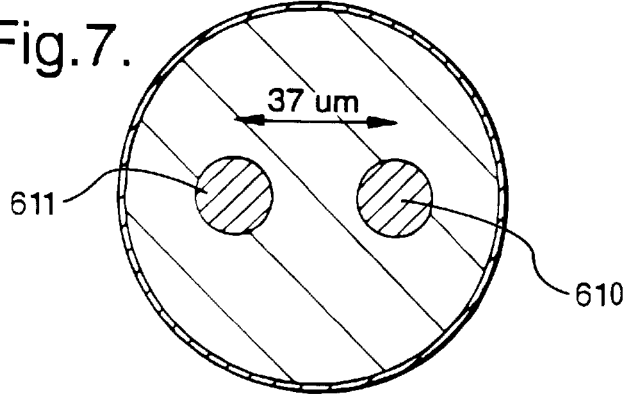
FIG. 7 shows a third example of an optical bus.

FIG. 7 shows another alternative construction for the optical bus. This example uses a twin-core optical fibre. Two cores 610,611, each of 3.8 $\mu$m diameter are separated by 37 $\mu$m. Each of the cores provides one of the two waveguides 21,22 of FIG. 2. A suitable twin-core fibre is described in the paper by B. K. Nayar et al., "All-optical switching in a 200-m twin-core fibre non-linear Mach-Zehnder interferometer", OPTICS LETTERS, 16, 6, 3.91, pp 408–410.

Figure 3:
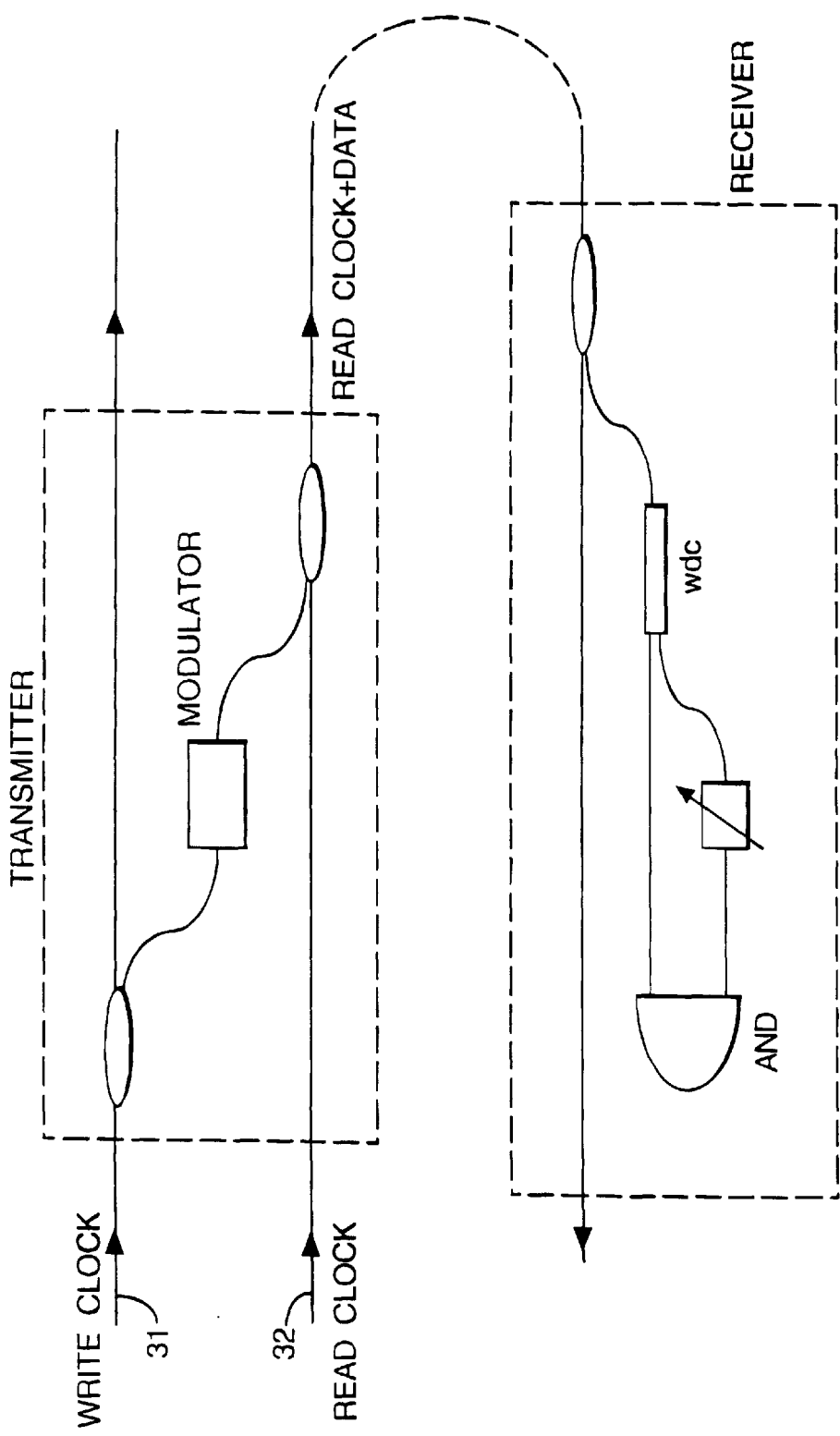
FIG. 3 shows a second example of a node for use in the network of FIG. 1.

Although in the example of FIG. 2, a single clock is used for both writing data at the node transmitters and reading data at the node receivers, other arrangements are possible. FIG. 3 shows an implementation in which separate synchronized clocks are used for reading and writing. The two clocks are at different wavelengths. In this example, the write clock output onto the first waveguide 31 is at 1560 nm and the read clock output onto the second waveguide 32 is at 1540 nm. The two clock signals must have low relative jitter and may be derived from a single master source by super-continuum generation. In this technique, a short pulse from an optical source is amplified to a level where non-linear effects such as self-phase modulation result in the spreading of the spectrum of the pulse. For example, a pulse having an initial bandwidth of around 3 nm may be spread over 100 nm. Optical filters may then be used to carve out from the spectrum two or more pulses in different wavelength regions. The relative timing of these two pulses is fixed. This technique is described in further detail in Morioka, Uchiyama, Saruwatari, "Multiwave Picosecond Pulse Source with Low Jitter and High Optical Frequency Stability Based on 200 nm Supercontinuum Filtering" Electronics Letters, June 22, 1995, vol. 31, no. 13, page 1064. FIG. 15 shows schematically a master clock source using super continuum generation. The non-linear medium in this case is a length of optical fibre joining the optical pulse source via a splitter to 2 optical bandpass filters which select the respective frequencies.

As in the first example, at the node transmitter a portion is tapped from the write clock fibre. This is modulated with data and added to the fibre carrying the read clock. The modulator applies a variable delay, so that the data is written in the time slot appropriate to the particular node. At a node receiver, the second fibre carrying the read clock and the modulated data, is tapped. The read clock is separated from the data using a wavelength dependent coupler WDC. A variable delay is then applied to the clock, as in the first example. The delayed clock is ANDed (i.e., an AND operation is performed) with the data signal to read a given channel.

Figure 4:
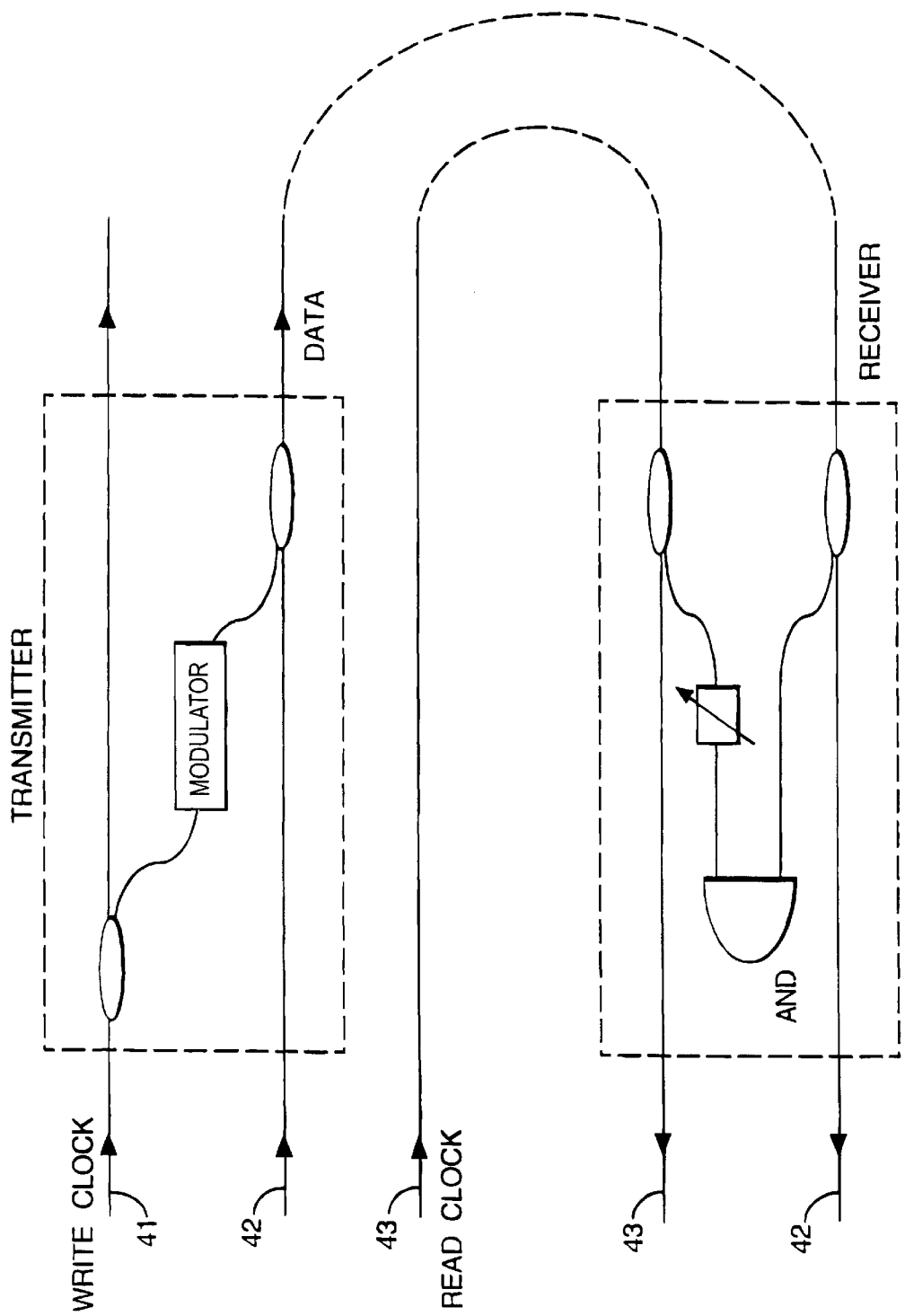
FIG. 4 shows a third example of a node for use in the network of FIG. 1.

FIG. 4 shows a third example. This is closely similar to the immediately preceding example, in that it uses separate write and read clocks. Three waveguides are used. The node transmitter taps the write clock from a first waveguide 41, and writes the modulated data onto a second waveguide 42. A third waveguide 43 is tapped by the node receiver, and carries a read clock used by the receiver in reading data from the second waveguide 42.

Although in the example illustrated in the Figures, only 2 or 3 network nodes are shown, in practice the present invention may be used in a network having many more nodes. An important parameter in determining the number of nodes, and correspondingly the number of TDMA channels, is the extinction ratio of the modulator used to read channels in the receiver. The relationship between the extinction ratio and the number of channels is as follows:

extinction ratio (in dB)=20+10 log (number of channels −1).

This implies, for example, that a network having 16 channels and connecting 16 nodes requires a 31.8 dB extinction ratio. This is obtainable with, for example, an electro-absorption modulator of the type identified above.

Figure 10:
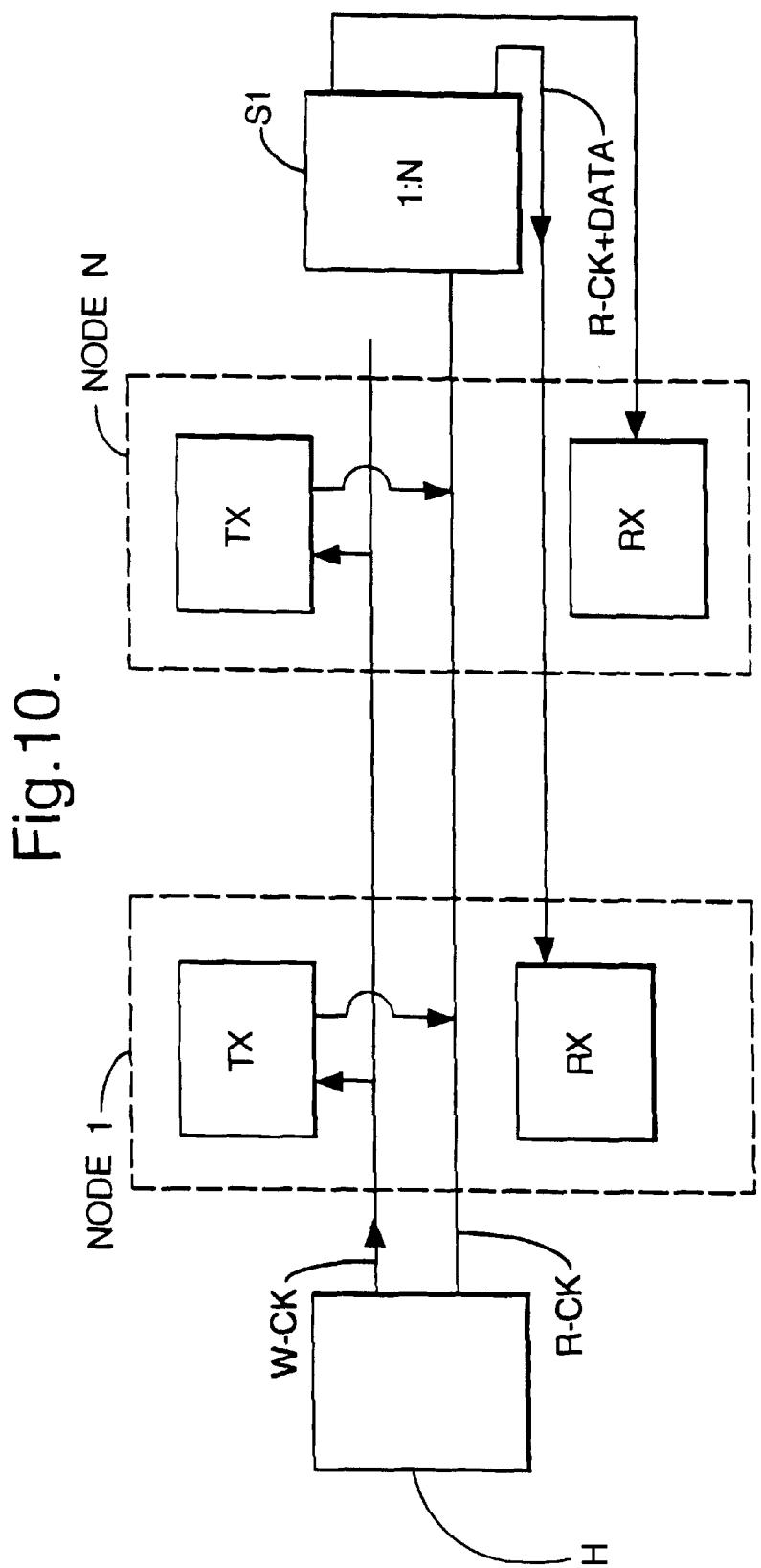
FIG. 10 shows a second example of a network with receivers connected in a star topology.
Figure 11:
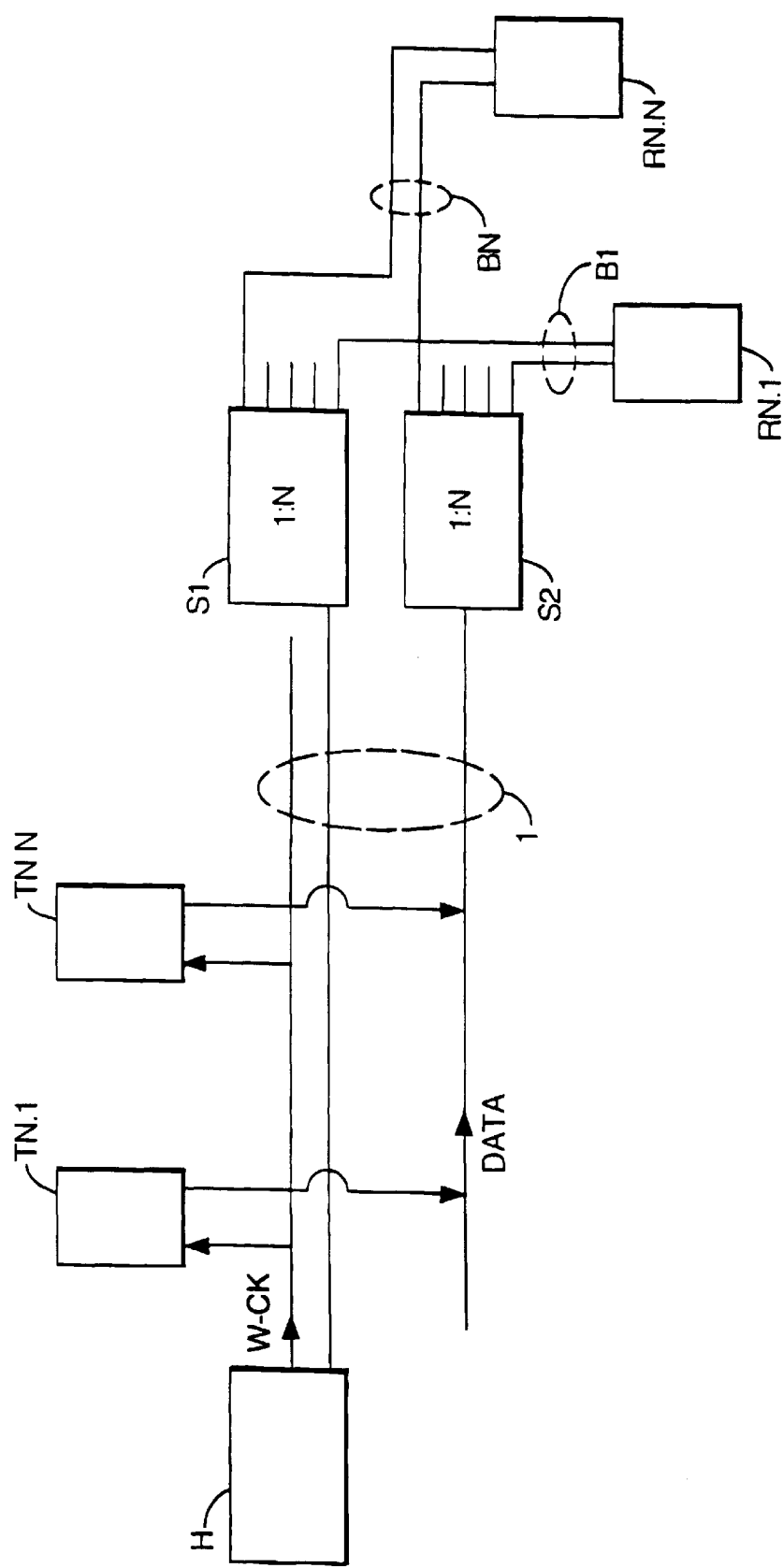
FIG. 11 shows a third example of a network with receivers connected in a star topology.

Although in the examples so far described all receiver nodes are connected directly to the optical bus, alternative configurations are possible. In particular, it is advantageous to connect the receiver nodes in a star-configured network. A star configuration has the advantage of increased resilience, in that a break in a single branch still leaves the other branches operational. The star network may be coupled to the bus by one or more 1:N splitters, where N is the number of receiver nodes. FIG. 9 shows a first example of such a network. Here the head-end master clock source H transmits a single clock signal CK on one of the fibre waveguides, as in the network of FIG. 2. Two splitters S1, S2 couple clock and data signals respectively to the different branches B1 to BN of a star network. The branches are terminated by receiver nodes RN.1 to RN.N. Each branch may have the same physical construction as the bus 1. FIG. 10 shows a second example. This is analogous to the network of FIG. 3, in that separate write and read clocks are transmitted onto the two waveguides of the bus. In this example only a single splitter is required, since the read clock and data are received by each receiver node over a common path. FIG. 11 shows a final example based on the network of FIG. 4 and using separate waveguides for the read clock, for the write clock and for the data. As shown in the Figure, this requires two splitters to couple the star network to the bus.

A star topology for the receivers may be used both when the receivers are separate from the transmitters, as in, for example, the network of FIG. 9, and also when transmitter nodes and receiver nodes are combined in the same locations, as in the network of FIG. 10. In this latter case, the star network and the bus may run through a single cable.

Although the discussion above has assumed that the optical pulses are bright pulses from a modulated pulse source, the invention may also be implemented using dark pulses, as described and claimed in our copending International Patent Application PCT/GB97/00520. A dark pulse is a temporal gap, or a region of reduced intensity radiation in an essentially continuous burst of optical radiation. In this case the optical source may comprise a distributed feedback (DFB) laser operating at 1555 nm followed by an electro-absorption modulator (EAM) which has a maximum extinction ratio of 20 dB and a mean absorption characteristic of 2.5 dBN. A 10 ghz sinewave drive is then synchronized with and passively added to a 10 Gbit/sdata sequence from a data source 144 via a power splitter 140 (used in reverse to combine the two signals). A suitable power splitter is the Wiltron K2408, available from Anritsu Wiltron. Both the sinewave and data sequence signal levels have a 2.5V peak-to-peak amplitude. The resulting signal comprises a sinewave with an offset voltage determined by the data signal, with the relative amplitudes arranged such that the maximum value of the cycle for a data 0 is below the minimum level for a data 1. It will be appreciated that this precise arrangement is not necessary, and it would be sufficient to ensure that the entire 10 GHz cycle remains in the low absorption region of the modulator for a data 1. The electrical signal is applied to the EAM 120, and the DC bias is adjusted to ensure that the entire cycle for a data 1 gives low extinction, while the troughs of the cycle for a data 0 give a high extinction. Consequently, dark-pulses are formed for data 0's, whilst a low extinction is maintained for data 1's.

An EAM suitable for use in the system is the one described in, for example, "Generation of 6.3 ps optical pulses at a 10 GHz repetition rate using a packaged EAM and dispersion compensating fibre", Electronics Letters, Volume 30, pp 1700–1701, which is incorporated herein by reference.

What is claimed is:

1. An optical network comprising:
    (a) an optical bus including at least two co-located optical fibre waveguides;
    (b) a plurality of transmitter nodes, each transmitter node including a transmitter stage connected to the optical bus and arranged to receive an optical write clock signal from one of the fibre waveguides and to write an optical data signal, in a time slot synchronized to the optical write clock signal, onto another one of the fibre waveguides, each transmitter stage including a modulator and being arranged to write the optical data signal by modulating the write clock signal received from said one of the waveguides; and
    (c) at least one receiver node, the receiver node including a receiver stage for receiving an optical data signal output onto the optical bus by the transmitter stage of a transmitter node, the receiver stage also being arranged to read an optical read clock signal from a second one of the optical fibre waveguides.

2. An optical network according to claim 1, wherein the read clock and write clock signals are at different wavelengths, and
    an output from the transmitter stage is connected to said second one of the optical fibre waveguides, the transmitter stage being capable of writing data onto the second one of the optical fibre waveguides at the wavelength of the write clock signal.

3. An optical network according to claim 1, in which the optical bus includes at least three co-located optical fibre waveguides:

a first waveguide for carrying said read clock;

a second waveguide for carrying said write clock; and a third waveguide for carrying the optical data signal.

4. An optical network according to claim 3, wherein optical fibre waveguides comprise a plurality of waveguide cores within a single optical fibre.

5. An optical network according to claim 1 wherein the optical fibre waveguides comprise a plurality of fibres located within a single cable.

6. An optical network according to claim 1, wherein the at least one receiver node is connected to the network by optical fibre waveguides having a star topology.

7. A local area network (LAN) suitable for interconnecting a plurality of computer systems and comprising an optical network according to claims 1.

8. An optical network according to claim 1, wherein said another of the fibre waveguides onto which said optical write clock signal is written is the same waveguide as said second waveguide from which said optical read clock signal is read.

9. A method of operating an optical network comprising an optical bus comprising at least two co-located optical fibre waveguides, a plurality of transmitter nodes connected to the optical bus, and a receiver node, the method comprising:

(a) at a transmitter node, receiving an optical write clock signal from one of the fibre waveguides, and writing an optical data signal by modulating said optical write clock signal, in a time slot synchronized to the optical clock signal, onto another one of the fibre waveguides, and (b) at a receiver node, receiving an optical data signal which was output onto the optical bus in step (a) and reading the optical data signal using an optical read clock signal which is carried in a second of said optical fibre waveguides.

10. A method according to claim 9, in which step (a) includes modulating the optical clock signal received from one of the fibre waveguides and thereby generating the optical data signal.

11. A method according to claim 9, wherein said another of the fibre waveguides onto which said optical write clock signal is written is the same waveguide as said second waveguide from which said optical read clock signal is read.

* * * * *